United States Patent
Leith et al.

(10) Patent No.: US 7,205,187 B2
(45) Date of Patent: Apr. 17, 2007

(54) MICRO-FEATURE FILL PROCESS AND APPARATUS USING HEXACHLORODISILANE OR OTHER CHLORINE-CONTAINING SILICON PRECURSOR

(75) Inventors: Allen John Leith, Austin, TX (US); Anthony Dip, Cedar Creek, TX (US); Seungho Oh, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 66 days.

(21) Appl. No.: 11/035,730

(22) Filed: Jan. 18, 2005

(65) Prior Publication Data

US 2006/0160288 A1 Jul. 20, 2006

(51) Int. Cl.
*H01L 21/336* (2006.01)
*H01L 21/8234* (2006.01)

(52) U.S. Cl. .................................. 438/197; 438/637
(58) Field of Classification Search ................ 438/197, 438/597, 598, 637
See application file for complete search history.

(56) References Cited

U.S. PATENT DOCUMENTS 5,766,342 A  6/1998  Shibuya et al.
5,830,330 A  11/1998  Lantsman
6,184,158 B1  2/2001  Shufflebotham et al.
6,232,196 B1*  5/2001  Raaijmakers et al. ....... 438/386
2004/0009336 A1*  1/2004  Marcadal et al. ........... 428/210
2004/0188239 A1  9/2004  Robison et al.

FOREIGN PATENT DOCUMENTS

TW  432493  5/2001
TW  477075  2/2002

* cited by examiner

*Primary Examiner*—Phuc T. Dang
(74) *Attorney, Agent, or Firm*—Oblon, Spivak, McClelland, Maier & Neustadt, P.C.

(57) ABSTRACT

A method is provided for depositing a silicon-containing film in a micro-feature on a substrate by a low pressure deposition process in a processing system. A silicon-containing film can be formed in a micro-feature by providing a substrate in a process chamber of a processing system, and exposing a hexachlorodisilane (HCD) process gas to the substrate. A processing tool containing a processing system for forming a silicon-containing film in a micro-feature using a silicon and chlorine-containing gas such as a HCD process gas is provided. Alternatively, the micro-feature can be exposed to DCS, $SiCl_4$, and $SiHCl_3$ gases. Alternatively, the micro-feature can be exposed to ($SiH_4$+HCl).

35 Claims, 7 Drawing Sheets

ASPECT RATIO = D/W

MICRO-FEATURE FILL PROCESS AND APPARATUS USING HEXACHLORODISILANE OR OTHER CHLORINE-CONTAINING SILICON PRECURSOR

CROSS-REFERENCE TO RELATED APPLICATIONS

The present patent document is related to U.S. application Ser. No. 10/673,375 filed on Sep. 30, 2003, the entire contents of which are herein incorporated by reference.

FIELD OF THE INVENTION

The present invention relates to semiconductor processing, and more particularly, to a process and a processing tool for filling a micro-feature on a semiconductor substrate using hexachlorodisilane (HCD) process gas.

BACKGROUND OF THE INVENTION

During the fabrication of semiconductor devices, micro-features on the surface of the substrate are sometimes created in order to isolate devices or to create other devices such as capacitors etc. These micro-features are later filled, often by using silane ($SiH_4$). As circuit geometries shrink to ever smaller feature sizes, the aspect ratios (ratio of depth to width) of micro-features on substrates increase, see FIG. 1. When using a silane only, poly-silicon fill process, the level of defects inside the micro-feature increases as the micro-feature aspect ratio increases. Additionally, as absolute dimensions decrease, new mechanisms of defect generation not dependent on the micro-feature aspect ratio arise. One common defect is the creation of voids inside the micro-feature. These voids cause areas of high electrical resistance and may interfere with circuit operation.

Several possible causes of void formation are: depletion of deposition gas, differing nucleation characteristics, the presence of gas phase radicals, and hydrogen outgassing from the deposited film.

SUMMARY OF THE INVENTION

The term micro-feature, as used herein, refers to a feature formed in a substrate and/or in a layer or layers formed on a substrate that has dimensions on the micrometer scale, and typically the sub-micron scale, i.e., less than 1 μm. The micro-feature can, for example, be a trench, a hill, a valley or a via hole.

The inventors have discovered that void formation due to depletion of deposition gas may occur because $SiH_4$ is a transport limited reaction with a high deposition rate. The top A and bottom B of a micro-feature are shown in FIG. 2. As the deposition rate is dependent on the concentration of reactants near the substrate, fewer $SiH_4$ reactants may reach the bottom B of a micro-feature than reach the top A because reactants are deposited before reaching the bottom B. As the top of the micro-feature is exposed to more reactants, the deposition rate on the top A of the micro-feature is higher than on the bottom B of the micro-feature. As shown in FIG. 3, this higher deposition rate eventually chokes off the micro-feature opening, and no more reactants reach the bottom B of the micro-feature. Therefore, the higher the aspect ratio of the micro-feature the more likely the micro-feature opening will close prematurely, thus forming a void.

In order to prevent void formation caused by higher relative deposition rates occurring at the top of a micro-feature, conventional micro-feature filling techniques reduce overall deposition rates during the initial stages of deposition. The deposition rate is reduced when $SiH_4$ is combined with an inert gas, or the process temperature is reduced. Neither method reduces void formation to zero, especially when the micro-features have high aspect ratios.

A potential cause of voids that is unrelated to gas transport is the presence of gas phase radicals of $SiH_4$. There may be a tendency to getter these radicals at the wafer's edge, then secondly on the substrates surface and near and around the upper corners of the micro-features to be filled. As the gas phase population of these radicals is depleted in the micro-features, fewer of radicals will be available for deposition inside the micro-feature.

Hydrogen outgassing from the deposited film is another possible mechanism of void formation. It has been seen that post deposition processing at higher temperatures causes additional crystallization and hydrogen outgassing. The result is volume reduction in the deposited film and void formation.

Hydrogen outgassing occurs in other processes besides micro-feature filling itself. For example, one possible solution for solving transport issues related to micro-feature filling is to deposit an amorphous-silicon seed layer at a low temperature before attempting to fill the micro-feature. However, doing so causes hydrogen outgassing, in effect substituting one void formation mechanism for another.

Additionally, the inventors have discovered that as micro-feature openings get smaller, a new phenomenon of gap formation occurs. For micro-features with openings of around several hundred angstroms and depths of up to several thousand angstroms, the aspect ratio may be in the range of 5:1 or 10:1. Although this aspect ratio may be similar to that in previously known micro-features, the absolute dimensions of the micro-feature openings are much smaller than traditional micro-feature openings. As shown in FIG. 4, for micro-feature openings this small, closure of the micro-feature opening can occur via a mode different than mere preferential deposition at the top of micro-feature than the bottom. Voids formed by this mode have nearly rectangular cross-sections. The inventors have discovered that, rather than slow deposition at the bottom of the micro-feature, the deposition rate is virtually zero when the width of the micro-feature opening drops below a range of about 1000 angstroms to several hundred angstroms (on the order of Si seeds that may form randomly along the micro-feature sidewalls).

An object of the present invention is to provide a method and system for filling a micro-feature on a semiconductor wafer in a process chamber of a processing system which reduces or solves the above described and/or other problems with conventional deposition systems and methods.

Still another object of the present invention is to provide a cost effective mechanism for integrating silicon-containing films with semiconductor applications.

These and/or other objects of the present invention may be realized by a method of depositing a silicon-containing film on a substrate. The method includes providing a substrate in a process chamber of a processing system, flowing a hexachlorodisilane (HCD, $Si_2Cl_6$) process gas in the process chamber and inside micro-features on the substrate.

In another aspect of the invention, a processing tool is provided for depositing a silicon-containing material in a micro-feature without void formation. The processing tool contains a transfer system configured for providing a substrate in a process chamber of a processing system, a gas injection system configured to expose an HCD process gas to the substrate to deposit a silicon-containing material in a micro-feature, and a controller configured to control the processing tool.

DETAILED DESCRIPTION OF THE INVENTION

Figure 1:
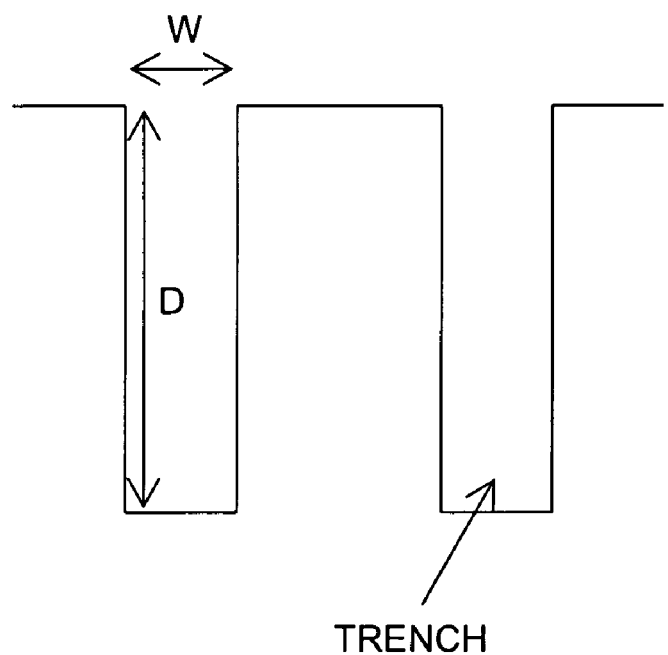
FIG. 1 shows a micro-feature on a substrate with width and depth identified.

The term micro-feature, as used herein, refers to a feature formed in a substrate and/or in a layer or layers formed on a substrate that has dimensions on the micrometer scale, and typically the sub-micron scale, i.e., less than 1 μm. The micro-feature can, for example, be a trench, a hill, a valley, or a via hole.

An exemplary embodiment of the invention details the use of HCD, or another chlorine-containing silicon precursor, as the main deposition gas for poly-silicon micro-feature fill. The deposition characteristics of HCD make it an ideal gas for this purpose. The deposition rate when using HCD is much lower at most operating temperatures than $SiH_4$. HCD is also a reaction limited deposition rather than a transport limited deposition. This reduces the problem of premature closing of the opening of the micro-feature because reactants are better able to reach the bottom of the micro-feature.

Additionally, unlike $SiH_4$, HCD contains no hydrogen. Therefore, the deposited film does not experience hydrogen outgassing as does a film deposited with $SiH_4$ alone. Furthermore, if the film is deposited with a hydrogen containing gas, chlorine available from the HCD, or another chlorine-containing gas will help reduce the level of hydrogen in the film thus reducing hydrogen outgassing. These characteristics make deposition with HCD or other chlorine-containing gases much more conformal to current and future structures than are conventional process gases, and voids are less likely to form in micro-features.

HCD acts as a curative to the problem of the presence of gas phase radicals in two ways. First, HCD provides a second source of more homogenous gas phase species resulting in a more conformal deposition. It is also an important source of chlorine, which helps to slow the rate of nuclei formation due to the gas phase radicals from $SiH_4$ or any other hydrogen-containing gas used in combination with the HCD.

Furthermore, HCD has better deposition characteristics for very small geometries. HCD deposition reduces or prevents early seed formation on the top of the micro-feature. As explained above, this seed formation can produce a near zero deposition rate at the bottom of the micro-feature. When this happens, deposition stops at a nearly horizontal line somewhere above the micro-feature bottom.

The deposition characteristics of HCD process gas can also be altered using additional gases. $H_2$, $GeH_4$, $B_2H_6$, $PH_3$, and $SiH_4$ as well as other gases can be introduced with HCD to affect either the deposition characteristics and/or the deposited films characteristics. $B_2H_6$, and $PH_3$ will affect the conductivity, for example, and $H_2$ and $SiH_4$ can be added to increase the deposition rate. Typically, films created during micro-feature fill processes are very thick, therefore, deposition by a process with a low deposition rate is not usually practical for creation of the full film thickness. The addition of $H_2$ and/or $SiH_4$ will increase the deposition rate to a manufacturable level.

Depending on the geometries to be filled, it is possible to start out with an HCD or other chlorine-containing silicon precursor, to deposit an initial layer on the bottom of the micro-feature, and then to switch to another process gas for the remainder of the deposition process. Switching the process gas this way can be used to reduce the processing time or to influence the smoothness of the later deposited material.

In one embodiment, the process gas can be HCD or a mixture of HCD at the start of the process and then the percentage of HCD may vary over the duration of the process. For example, in order to fill a micro-feature, HCD or a combination of HCD and another gas can be used in the beginning of the process. Then, shortly before the micro-feature is substantially filled, the process gas may be changed to a gas or gas combination with a higher deposition rate. Another change in process gas can be made when the micro-feature is substantially filled, or shortly after the micro-feature is filled. Alternatively, the gas combination can be continuously varied during the process. In one embodiment, the percentage process gas which is HCD can be reduced in small increments or along a gradual curve while the percentage of another gas with a higher deposition rate increases gradually.

If the process gas is to be switched from HCD or another similar gas at or around the time the micro-feature is filled, such a switching point may be identified via mathematical calculation or via trial and error, for example.

Some benefits of using HCD as a process gas may be achieved by using alternative chlorine-containing silicon precursors, but process temperatures may increase. Examples of these are: $SiH_4$+HCl, dichlorosilane, tetrachlorosilane, and trichlorosilane etc. These chlorine-containing gases can also be used in combination with the additional gases listed above to achieve the same deposition and/or deposited film characteristics. A process gas containing substantially only HCD as an active gas, for example, would be characterized as a process gas with only one molecular formula. A process gas containing both $SiH_4$ and HCl as active gases would be characterized as having more than one molecular formula.

In addition, a chlorine-containing gas can be added at various points in the process to affect deposition characteristics, even if the gas itself may not contain silicon.

The ratio of HCD or other chlorine-containing precursor to $SiH_4$ is normally in the range of: (pure HCD with substantially no $SiH_4$) up to a combination of (about 1 unit HCD: 4 units $SiH_4$). A preferred range is from (2 units HCD: 1 unit $SiH_4$) to (1 unit HCD: 2 units $SiH_4$). A typical ratio of HCD or other chlorine-containing precursor to $SiH_4$ is about 50% HCD by volume and 50% $SiH_4$ by volume. An inert gas may or may not be included.

It is significant that the use of traditional silicon source gases will not provide low temperature deposition of silicon-containing films or strong selectivity of the film growth. Nevertheless, use of other silicon source gases has gone largely unstudied, perhaps due to the difficulty of implementing new source gases in the semiconductor industry and the problem of providing uniform process results at different wafer positions in a batch type process chamber. Thus, the present inventors have conducted experiments to analyze the use of a hexachlorodisilane (HCD) process gas to deposit a silicon-containing film in micro-features on a substrate. As a result of such experiments and analysis, the present inventors have discovered that low pressure exposure of a HCD process gas provides a feasible mechanism for low temperature deposition of a silicon-containing film in a micro-feature in a processing system.

Where the HCD process gas is not exposed to a silicon surface but to other surfaces containing materials such as oxides, nitrides, or metals, deposition of a silicon-containing film using a HCD process gas can form a polycrystalline silicon-containing film having fine silicon grains, or an amorphous silicon-containing film. The grain size in a polycrystalline silicon-containing film can depend on deposition conditions as well as heat treatments.

HCD is a commercially available silicon compound that is highly reactive and a very strong deoxygenation agent. As a result of experiments and analysis of using a HCD process gas to deposit silicon-containing films in a processing system, the present inventors have discovered a low-pressure thermal decomposition process using a HCD process gas to deposit a silicon-containing film on a substrate at a deposition rate that is higher than can be achieved at the same temperature using conventional decomposition of DCS in the presence of $H_2$ or HCl. The higher deposition rate that can be obtained using HCD can, for example, allow manufacturable deposition processes to be carried out at a lower substrate temperature, while achieving sufficiently high deposition rates of silicon-containing films. Although the above-mentioned experiments are described in terms of running in a batch type processing system, the invention is not limited to such processing systems and can also be practiced in single wafer processing systems as will be appreciated by one skilled in the art.

In particular, a silicon-containing film can be deposited on a substrate using an HCD process gas in a low pressure deposition process in a processing system. The same or similar process can be used for filling micro-features on a substrate. In the process, a substrate is provided in a process chamber, the chamber pressure lowered using a vacuum pumping system, and the chamber temperature and pressure stabilized. Next, the process chamber temperature and process chamber pressure can be adjusted to the desired values. When the process temperature is reached, the substrate can be processed for a time period that results in formation of a desired silicon-containing film on the substrate. At the end of the process, the process chamber can be evacuated and purged with an inert gas, and the substrate removed from the process chamber. In addition, a process of pretreating a substrate prior to depositing a silicon-containing film or filling a micro-feature can be performed. This pretreatment can include exposing a substrate to a cleaning gas, for example a $H_2$ gas at a substrate temperature of 900° C., to remove contaminants and oxide layers from the substrate.

Figure 5:
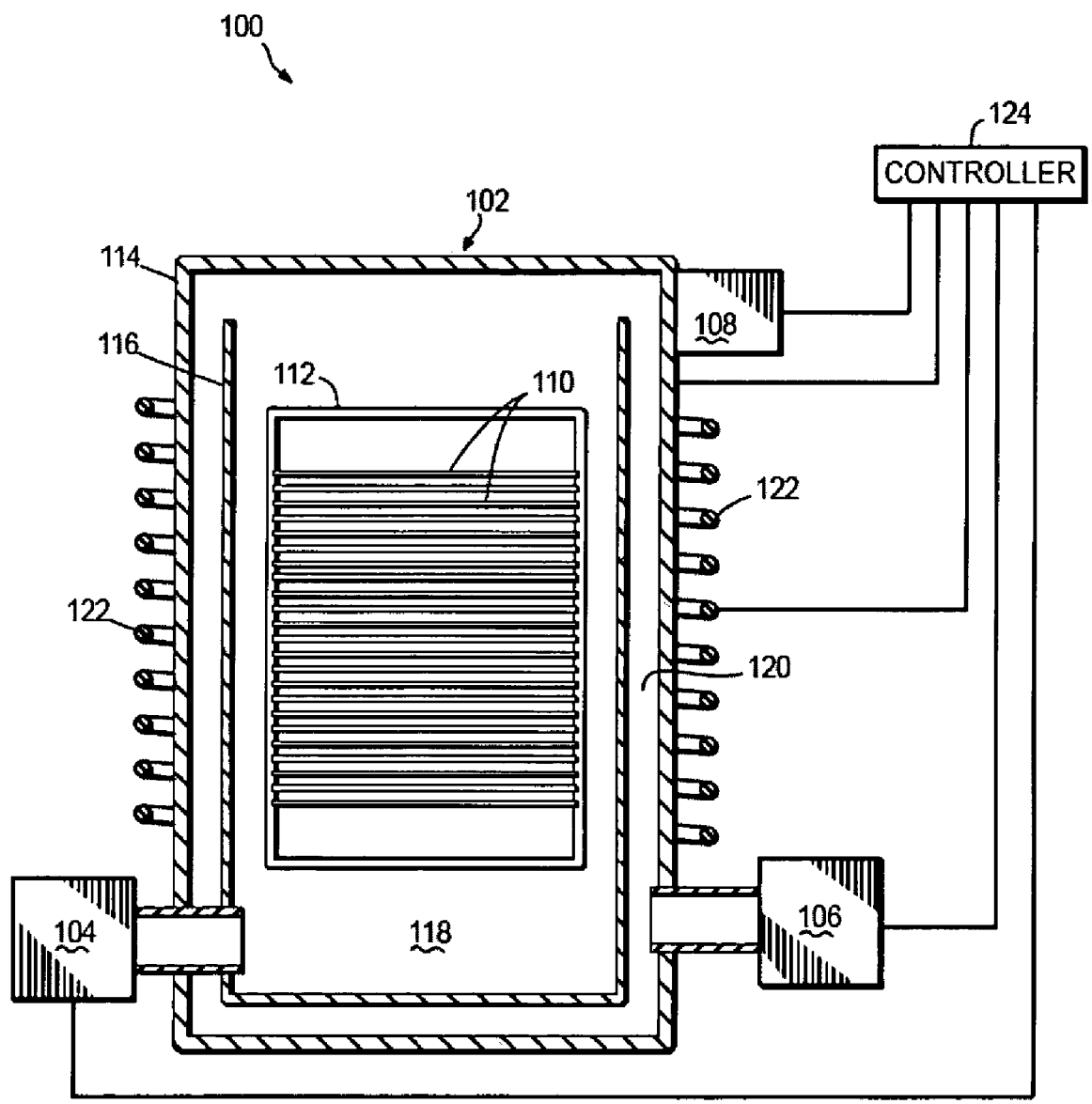
FIG. 5 shows a simplified block diagram of a batch type processing system for depositing a silicon-containing film on a substrate according to an embodiment of the invention.

Referring now to the drawings, FIG. 5 shows a simplified block diagram of a batch type processing system for depositing a silicon-containing film on a substrate according to an embodiment of the invention. The batch type processing system 100 includes a process chamber 102, a gas injection system 104, a heater 122, a vacuum pumping system 106, a process monitoring system 108, and a controller 124. Multiple substrates 110 can be loaded into the process chamber 102 and processed using substrate holder 112. Furthermore, the process chamber 102 comprises an outer section 114 and an inner section 116. In one embodiment of the invention, the inner section 116 can be a process tube.

The gas injection system 104 can introduce gases into the process chamber 102 for purging the process chamber 102, and for preparing, cleaning, and processing the substrates 110. The gas injection system 104 can, for example, include a liquid delivery system (LDS) that contains a vaporizer to vaporize a HCD liquid. The vaporized liquid can be flowed into the process chamber 102 with the aid of a carrier gas. Alternately, the gas injection system can include a bubbling system where a carrier gas is bubbled through a reservoir containing the HCD precursor. A plurality of gas supply lines can be arranged to flow gases into the process chamber 102. The gases can be introduced into volume 118, defined by the inner section 116, and exposed to substrates 110. Thereafter, the gases can flow into the volume 120, defined by the inner section 116 and the outer section 114, and exhausted from the process chamber 102 by the vacuum pumping system 106.

Substrates 110 can be loaded into the process chamber 102 and processed using substrate holder 112. The batch type processing system 100 can allow for a large number of tightly stacked substrates 110 to be processed, thereby resulting in high substrate throughput. A substrate batch size can, for example, be about 100 substrates (wafers), or less. Alternately, the batch size can be about 25 substrates, or less. The process chamber 102 can, for example, process a substrate of any size, for example 200 mm substrates, 300 mm substrates, or an even larger substrates. The substrates 110 can, for example, comprise semiconductor substrates (e.g. silicon or compound semiconductor), LCD substrates, and glass substrates. In addition to clean substrates, substrates with multiple films formed thereon can be utilized, including but not limited to, silicon films, metal films, oxide films, nitride films, and oxynitride films.

The batch type processing system 100 can be controlled by a controller 124 capable of generating control voltages sufficient to communicate and activate inputs of the batch type processing system 100 as well as monitor outputs from the batch type processing system 100. Moreover, the controller 124 can be coupled to and exchange information with process chamber 102, gas injection system 104, heater 122, process monitoring system 108, and vacuum pumping system 106. For example, a program stored in the memory of the controller 124 can be utilized to control the aforementioned components of the batch type processing system 100 according to a stored process recipe. One example of controller 124 is a DELL PRECISION WORKSTATION 610™, available from Dell Corporation, Dallas, Tex.

Real-time process monitoring can be carried out using process monitoring system 108. In general, the process monitoring system 108 is a versatile monitoring system and can, for example, comprise a mass spectrometer (MS) or a Fourier Transform Infra-red (FTIR) spectrometer. The process monitoring system 108 can provide qualitative and quantitative analysis of the gaseous chemical species in the process environment. Process parameters that can be monitored include gas flows, gas pressure, ratios of gaseous species, and gas purities. These parameters can be correlated with prior process results and various physical properties of the deposited silicon-containing film.

Figure 6:
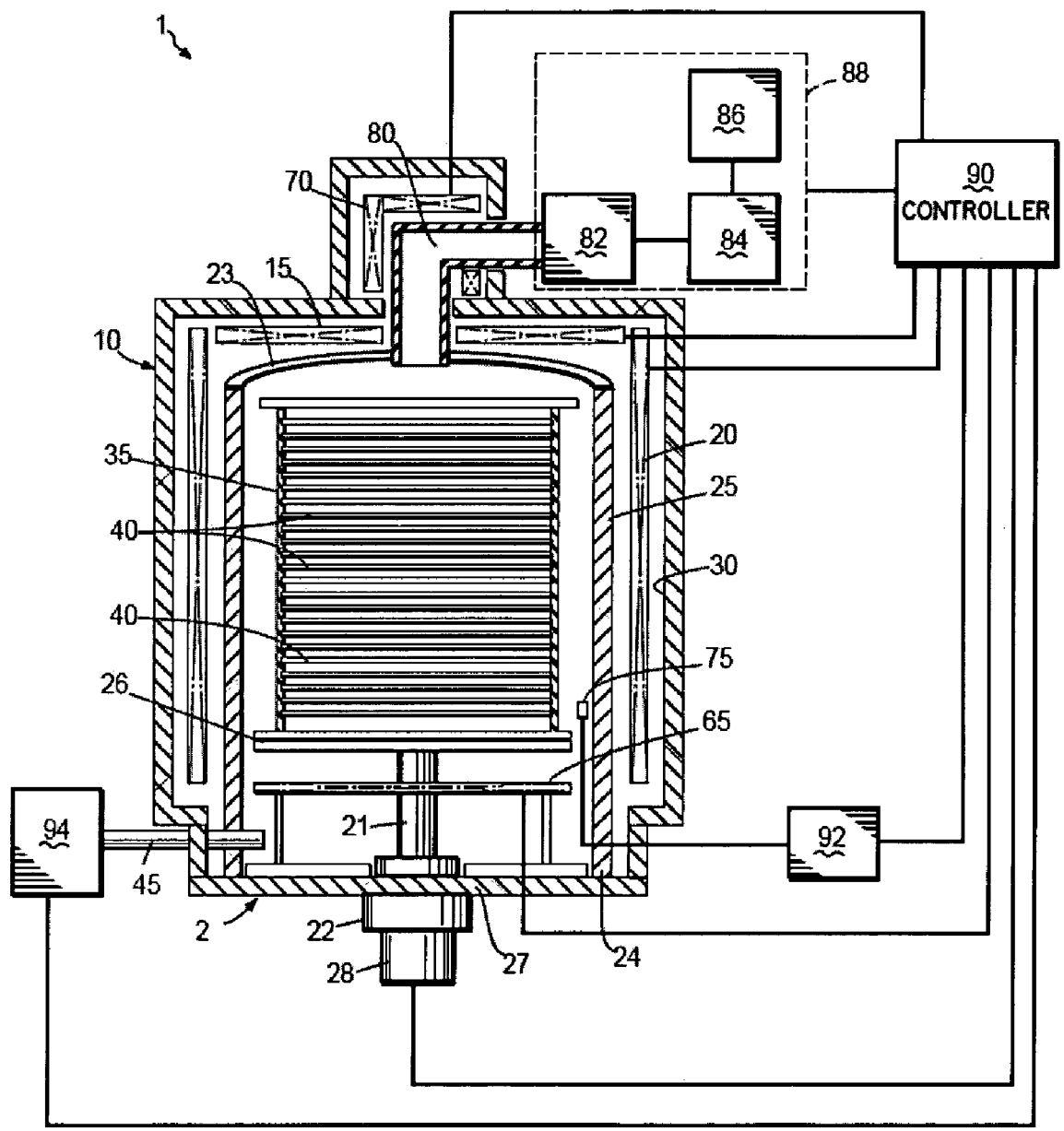
FIG. 6 shows a simplified block diagram of another batch type processing system for depositing a silicon-containing film on a substrate according to an embodiment of the invention.

FIG. 6 shows a simplified block diagram of another batch type processing system for depositing a silicon-containing film on a substrate according to an embodiment of the invention. The batch type processing system 1 contains a process chamber 10 and a process tube 25 that has an upper end connected to an exhaust pipe 80, and a lower end hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the reaction tube 25. When the lid 27 is positioned at its uppermost position, the lid 27 is adapted to close the open end of the manifold 2.

A plurality of gas supply lines can be arranged around the manifold 2 to supply a plurality of gases into the process tube 25 through the gas supply lines. In FIG. 6, only one gas supply line 45 among the plurality of gas supply lines is shown. The gas supply line 45 is connected to a gas injection system 94. A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as cooling medium passage.

A vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas injection system 94 and the process pressure can be adjusted by the APC 82. The trap 84 can collect unreacted precursor material and by-products from the process chamber 10.

The process monitoring system 92 comprises a sensor 75 capable of real-time process monitoring and can, for example, comprise a MS or a FTIR spectrometer. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas injection system 94, motor 28, process monitoring system 92, heaters 20, 15, 65, and 70, and vacuum pumping system 88. As with the controller 124 of FIG. 1, the controller 90 may be implemented as a DELL PRECISION WORKSTATION 610™.

Figure 7:
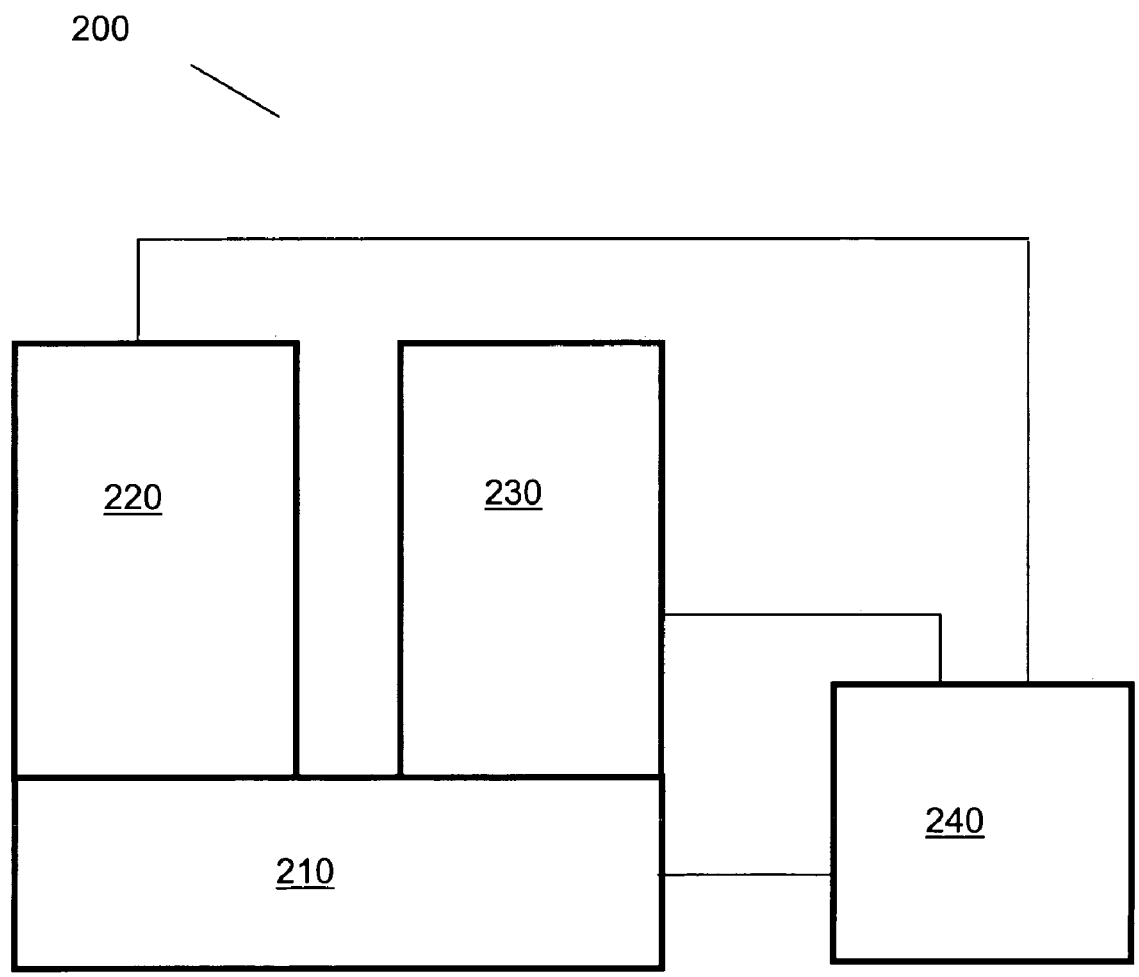
FIG. 7 shows a simplified block diagram of a processing tool according to an embodiment of the invention.

FIG. 7 shows a simplified block diagram of a processing tool according to an embodiment of the invention. The processing tool 200 comprises processing systems 220 and 230, a (robotic) transfer system 210 configured for transferring substrates within the processing tool 200, and a controller 240 configured to control the processing tool 200. In another embodiment of the invention, the processing tool 200 can comprise a single processing system or, alternately, can comprise more than two processing systems. In FIG. 7, the processing systems 220 and 230 can, for example, perform at least one of the following processes: (a) pretreat a substrate, (b) deposit a silicon-containing film on a substrate, (c) determine the properties of at least one of a substrate and a silicon-containing film deposited on a substrate, and (d) fill a micro-feature with a silicon-containing material. In (a), a pretreating can, for example, be carried out to remove contaminants and/or thin oxide films (e.g., a native oxide film or a chemical oxide film) from the substrate surface. The presence of contaminants or oxide films on a silicon surface can inhibit formation of a proper silicon seed (nucleation) layer and thereby affect epitaxial silicon deposition. In one example, a pretreating can include exposing a substrate to a $H_2$ gas at a substrate temperature between about 500° C. and about 1000° C., for example 900° C. In (c), a film property may, for example, include thickness and dopant levels of a silicon-containing film. In (d), a micro-feature formed on a substrate may be filled despite having a high aspect ratio or an opening measuring less than 1000 angstroms. In one embodiment of the invention, each of the processes (a)–(d) can be performed in different processing systems. In another embodiment of the invention, at least two of the processes (a)–(d) are carried out in the same processing system. In one embodiment of the invention, at least one of the processing systems can include a batch type processing system or a single wafer processing system. In another embodiment of the invention, at least one of the processing systems can include a thermal processing system, a plasma processing system, or an atomic layer deposition system.

Figure 2:
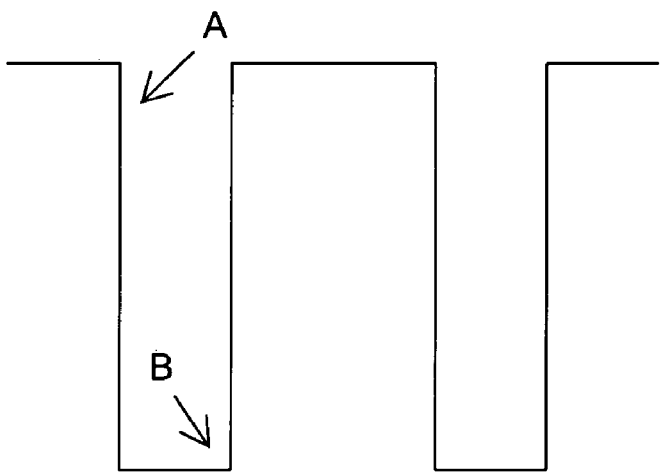
FIG. 2 shows another view of a micro-feature with the top and bottom regions identified.
Figure 3:
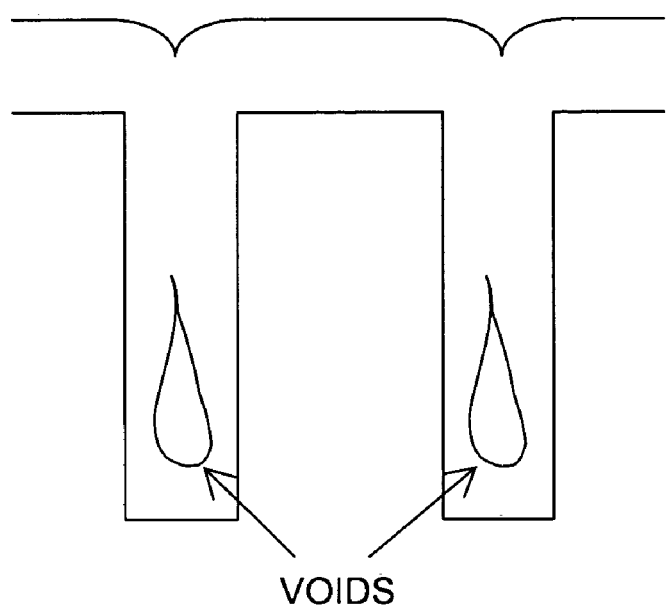
FIG. 3 shows voids inside a micro-feature after a filling process.
Figure 4:
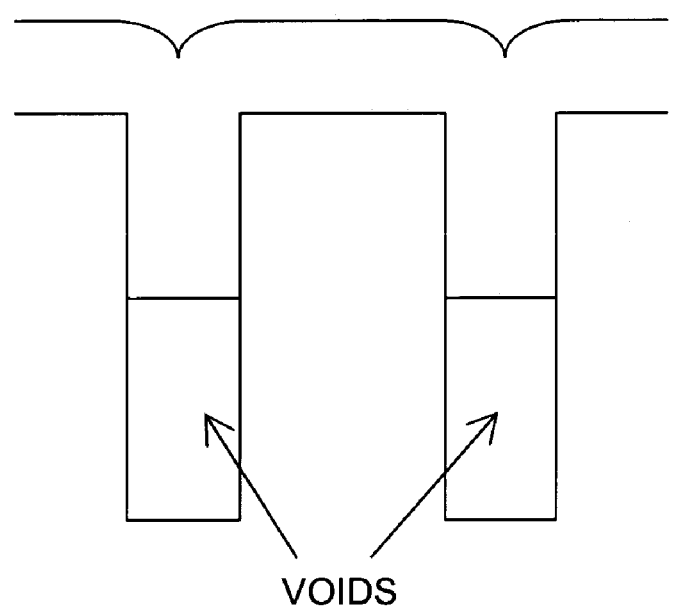
FIG. 4 shows voids formed when the absolute dimensions of a micro-feature become smaller than about 1000 angstroms.

As with the controllers in FIGS. 5 and 6, the controller 240 may be implemented as a DELL PRECISION WORKSTATION 610™. Moreover, the controller of any of FIGS. 5–6 and 2 may be implemented as a general purpose computer system such as that described with respect to FIG. 9.

Figure 8:
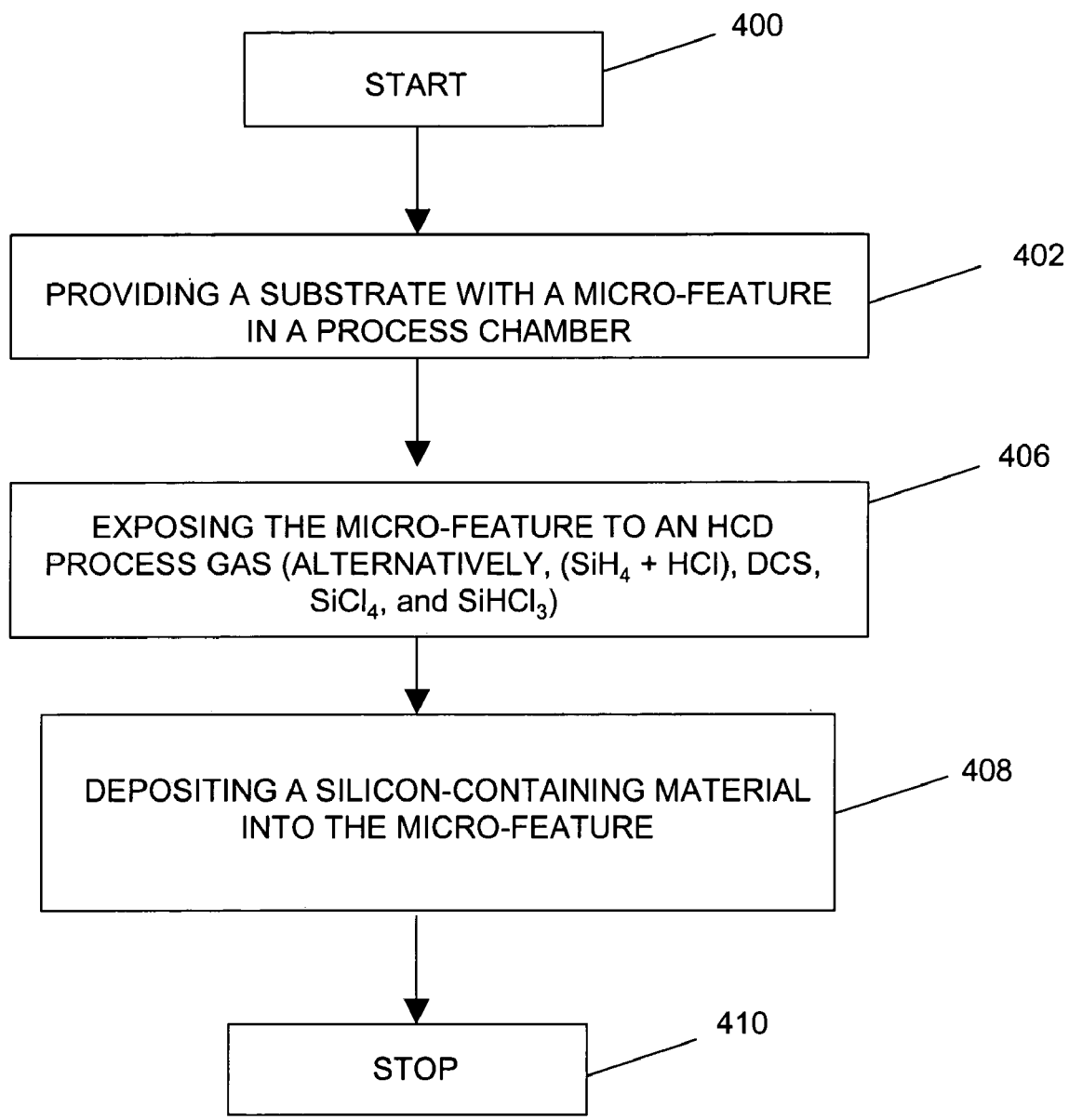
FIG. 8 shows a flow diagram for depositing a silicon-containing film in a micro-feature according to an embodiment of the invention.

In FIG. 8, a flowchart of the steps of the process is shown. The process starts with step 400. A substrate is placed in a process chamber via robot or by hand in step 402. It should be noted that at this time, a micro-feature may already exist on the substrate, or, the micro-feature may be formed after placement of the substrate into the process chamber. In step 406, the substrate and micro-feature are exposed to HCD gas or another chlorine-containing silicon precursor. The silicon containing material is deposited inside the micro-feature in step 408 and the process is stopped in step 410.

An inert gas may be used as a carrier gas for HCD in liquid form, or to dilute the HCD gas in order to reduce the occurrence of chemical reactions in the chamber environment rather than on the substrate surface or inside the micro-feature. In another embodiment of the invention, the HCD process gas can contain HCD gas and optionally an inert gas and at least one of a hydrogen-containing gas, and a second silicon-containing gas. The hydrogen-containing gas can, for example, contain $H_2$. It was observed that addition of $H_2$ and/or $SiH_4$ to the HCD gas increased the silicon deposition rate, and the addition of $B_2H_6$ and $PH_3$ will affect the conductivity. The second silicon-containing gas can, for example, be selected from $SiH_4$, $SiCl_4$, $Si_2H_6$, and $SiCl_2H_2$. In still another embodiment of the invention, the HCD process gas can contain HCD gas and a dopant gas that can, for example, be selected from a phosphor-containing gas (e.g., $PH_3$), an arsenic-containing gas (e.g., $AsH_3$), a nitrogen-containing gas (e.g., $NH_3$), and a boron-containing gases (e.g., $B_2H_6$ and $BCl_3$). In another embodiment of the invention, the HCD process gas can contain a halogen-containing gas that can, for example, be selected from HF, $F_2$, $Cl_2$, $NF_3$, and HCl. In yet another embodiment of the invention, the HCD process gas can contain HCD gas and a germanium-containing gas that can, for example, be selected from $GeH_4$ and $GeCl_4$, to deposit a SiGe film. Additionally, $B_2H_6$ can be used. In another embodiment, the micro-feature fill gas combination can include: $SiH_4$+HCl, DCS, $SiCl_4$, or $SiHCl_3$.

In one embodiment of the invention, the deposition process depicted in the flow diagram in FIG. 8, can further include pretreating the substrate prior to depositing the silicon-containing film. The pretreating process can, for example, substantially remove an oxide layer (e.g., a native oxide or a thermal oxide) from a substrate material (e.g., silicon), and other interfacial contamination, that can inhibit formation of a proper silicon seed (nucleation) layer, prevent deposition of a silicon-containing film on the deposition surface, reduce the selectivity of the silicon deposition, and prevent complete filling of a micro-feature. In one example, a pretreating can include exposing a silicon substrate to an $H_2$ gas at a substrate temperature of 900° C.

Processing conditions used for depositing a silicon-containing film can include a process chamber pressure less than about 1 Torr. Exemplary process gas pressure can be approximately about 0.1 Torr, but preferably the pressure is about 0.2 Torr. The process conditions can further include a substrate temperature between about 500° C. and about 650° C., preferably about 600° C. In 408 a silicon-containing film is deposited on the substrate from decomposition of the HCD process gas.

Suitable process conditions that enable filling a micro-feature with a silicon-containing film with desired film properties can be determined by direct experimentation and/or design of experiments (DOE). Adjustable process parameters can, for example, comprise substrate temperature, process pressure, type of process gas and relative gas flows. As mentioned above, the HCD process gas can, for example, contain HCD gas and optionally an inert gas and at least one of a hydrogen-containing gas, and a second silicon-containing gas. The HCD gas flow rate can, for example, be between about 5 sccm and about 1,000 sccm, the inert gas flow (if any) rate can, for example, be between about 5 sccm and about 20,000 sccm, the hydrogen-containing gas flow rate can, for example, be between about 5 sccm and about 5000 sccm, and the second silicon-containing gas flow rate can, for example, be between about 10 sccm and about 1,000 sccm.

In one embodiment of the present invention, the process temperature is about 600° C., the chamber pressure is about 200 mTorr and the process gas is run at about 40 sccm of HCD and 40 sccm of $SiH_4$.

Typical deposition rates using HCD may be lower than the deposition rate of pure $SiH_4$ which has a typical deposition rate of about 80 angstroms/minute. The deposition rate of pure HCD is on the order of about 4 angstroms/minute. For example, a deposition rate of about 4 angstroms/minute corresponds to a process gas of about 100% HCD.

Figure 9:
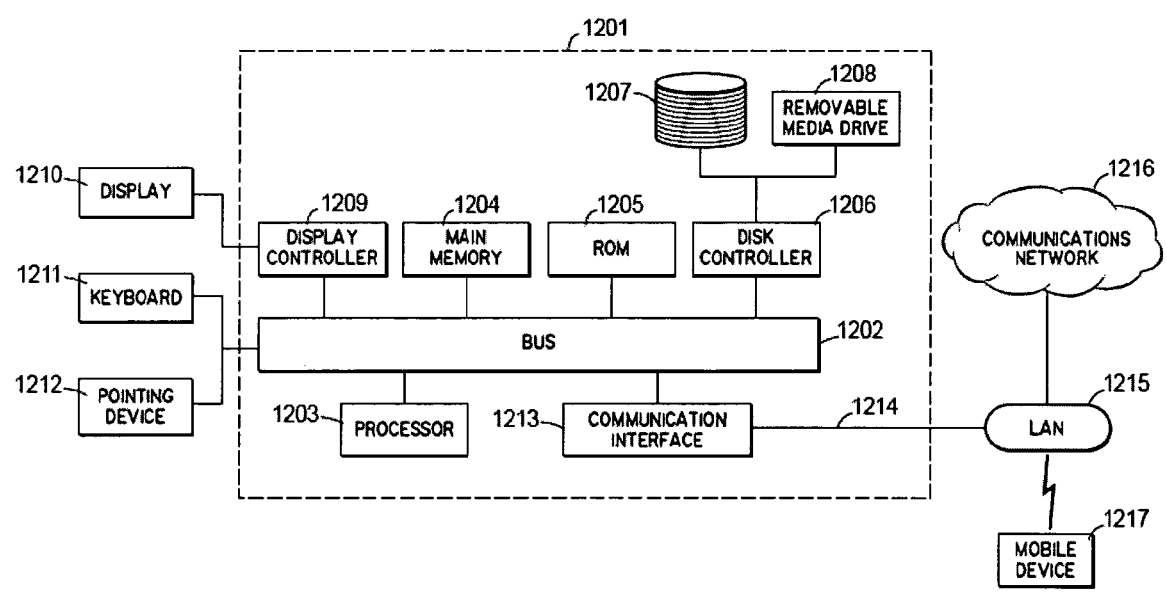
FIG. 9 shows a general purpose computer which may be used to implement the present invention.

FIG. 9 illustrates a computer system 1201 for use with an embodiment of the present invention. The computer system 1201 may be used as the controller of FIG. 5, 6, or 7, or a similar controller that may be used with the systems of these figures to perform any or all of the functions described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)). The computer system may also include one or more digital signal processors (DSPs) such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used.

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the microprocessor based processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1215 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 may be implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of depositing a silicon-containing material in a micro-feature on a substrate, the method comprising:
    providing a substrate including a micro-feature in a process chamber of a processing system;
    exposing a silicon-containing process gas to the micro-feature, wherein the silicon-containing process gas is at least one of the group consisting of: HCD, DCS, SiCl$_4$, and SiHCl$_3$, or combinations thereof; and depositing a silicon-containing material derived from the silicon-containing gas in the micro-feature while reducing a percentage of the silicon-containing process gas as a percentage of process gas in the process chamber and increasing a percentage of a second process gas exposed to the micro-feature with a higher deposition rate.

2. The method according to claim 1, wherein the exposing further comprises flowing the silicon-containing process gas at a flow rate between about 5 sccm and about 1,000 sccm.

3. The method according to claim 1, wherein the exposing further comprises flowing the silicon-containing process gas at a flow rate of about 80 sccm.

4. The method according to claim 1, wherein the exposing further comprises exposing a hydrogen-containing gas to the micro-feature.

5. The method according to claim 1, wherein the exposing further comprises exposing to the micro-feature a hydrogen-containing gas comprising at least one of: H$_2$, GeH$_4$, B$_2$H$_6$, PH$_3$, and SiH$_4$ to the micro-feature, or any combination thereof.

6. The method according to claim 5, wherein the ratio of silicon-containing gas to the hydrogen-containing gas is between about 2:1 and 1:2.

7. The method according to claim 1, wherein the exposing further comprises flowing a hydrogen-containing gas at a flow rate between about 5 sccm and about 5,000 sccm.

8. The method according to claim 1, wherein the exposing further comprises exposing a hydrogen-containing gas and a germanium-containing gas to the micro-feature.

9. The method according to claim 1, wherein the exposing further comprises first processing with the silicon-containing process gas, then changing the process gas to HCD and another silicon-containing gas before the micro-feature is substantially filled.

10. The method according to claim 1, wherein the exposing further comprises first processing with the silicon-containing process gas, then changing the process gas to another silicon-containing gas at about the time the micro-feature is substantially filled.

11. The method according to claim 1, wherein the exposing further comprises first processing with the silicon-containing process gas, then changing the process gas to HCD and another silicon-containing gas at about the time the micro-feature is substantially filled.

12. The method according to claim 1, wherein the exposing further comprises first processing with the silicon-containing process gas, then gradually varying the percentage of the silicon-containing process gas and gradually substituting another silicon-containing gas.

13. The method according to claim 1, further comprising providing a process chamber pressure between about 0.1 Torr and 1 Torr.

14. The method according to claim 1, further comprising providing a process chamber pressure of about 0.2 Torr.

15. A computer readable medium containing program instructions for execution on a processor, which when executed by the processor, cause a processing apparatus to perform the steps in the method recited in claim 1.

16. The method according to claim 1 wherein the percentage of the silicon-containing gas is reduced in increments.

17. The method according to claim 1 wherein the percentage of the silicon-containing gas is reduced along a gradual curve.

18. A method of depositing a silicon-containing material in a micro-feature on a substrate, the method comprising:
providing a substrate including a micro-feature in a process chamber of a processign system;
exposing a silicon-containing process gas to the micro-feature, wherein the silicon-containing process gas is at least one of the group consisting of: HCD, DCS, SiCl$_4$, and SiHCl$_3$, or combinations thereof; and
depositing a silicon-containing material derived form the silicon-containing gas in the micro-feature,
wherein the exposing further comprises exposing a second silicon-containing gas to the micro-feature.

19. The method according to claim 18, wherein the exposing further comprises flowing the second silicon-containing gas at a flow rate between about 5 sccm and about 1,000 sccm.

20. The method according to claim 18 wherein the exposing further comprises exposing a hydrogen-containing gas to the micro-feature.

21. The method according to claim 18 wherein the exposing further comprising exposing to the micro-feature a hydrogen-containing gas comprising at least one of: H$_2$, GeH$_4$, B$_2$H$_6$, PH$_3$, and SiH$_4$ to the micro-feature, or any combination thereof.

22. A method of depositing a silicon-containing material in a micro-feature on a substrate, the method comprising:
providing a substrate including a micro-feature in a process chamber of a processign system;
exposing a silicon-containing process gas to the micro-feature, wherein the silicon-containing process gas is at least one of the group consisting of: HCD, DCS, SiCl$_4$, and SiHCl$_3$, or combinations thereof; and
depositing a silicon-containing material derived form the silicon-containing gas in the micro-feature,
wherein the exposing further comprises exposing any two of HCD, (SiH$_4$+HCl), DCS, SiCl$_4$, (HCD+SiH$_4$), and SiHCl$_3$ to the micro-feature.

23. A method of depositing a silicon-containing material in a micro-feature on a substrate, the method comprising:
providing a substrate including a micro-feature in a process chamber of a processign system;
exposing a silicon-containing process gas to the micro-feature, wherein the silicon-containing process gas is at least one of the group consisting of: HCD, DCS, SiCl$_4$, and SiHCl$_3$, or combinations thereof; and
depositing a silicon-containing material derived form the silicon-containing gas in the micro-feature,
wherein the exposing further comprises exposing a hydrogen-containing gas and a second silicon-containing gas to the micro-feature.

24. A method of depositing a silicon-containing material in a micro-feature on a substrate, the method comprising:
providing a substrate including a micro-feature in a process chamber of a processign system;
exposing a silicon-containing process gas to the micro-feature, wherein the silicon-containing process gas is at least one of the group consisting of: HCD, DCS, SiCl$_4$, and SiHCl$_3$, or combinations thereof; and
depositing a silicon-containing material derived form the silicon-containing gas in the micro-feature,
wherein the exposing further comprises exposing the silicon-containing process gas and at least one of a phosphor-containing gas, a boron-containing gas, and a germanium-containing gas to the micro-feature.

25. The method according to claim 24 wherein the exposing further comprises exposing a hydrogen-containing gas to the substrate.

26. A method of depositing a silicon-containing material in a micro-feature on a substrate, the method comprising:
providing a substrate including a micro-feature in a process chamber of a processign system;
exposing a silicon-containing process gas to the micro-feature, wherein the silicon-containing process gas is at least one of the group consisting of: HCD, DCS, SiCl$_4$, and SiHCl$_3$, or combinations thereof; and
depositing a silicon-containing material derived form the silicon-containing gas in the micro-feature,
wherein the exposing further comprises exposing H$_2$ and GeH$_4$ to the micro-feature.

27. A method of depositing a silicon-containing material in a micro-feature on a substrate, the method comprising:
providing a substrate including a micro-feature in a process chamber of a processign system;
exposing a silicon-containing process gas to the micro-feature, wherein the silicon-containing process gas is at least one of the group consisting of: HCD, DCS, SiCl$_4$, and SiHCl$_3$, or combinations thereof; and
depositing a silicon-containing material derived form the silicon-containing gas in the micro-feature,
wherein the exposing further comprises first processing with the silicon-containing process gas, then changing the process gas to another silicon-containing gas before the micro-feature is substantially filled.

28. A processing tool for depositing a silicon-containing film in a micro-feature comprising:
a processing system;
a transfer system configured to provide a substrate including a micro-feature in a process chamber of the processing system;
a gas injection system configured to expose a silicon-containing process gas to the micro-feature in the processing system, wherein the silicon-containing process gas is selected from the group consisting of: HCD, DCS, SiCl$_4$, and SiHCl$_3$, and the gas injection system is further configured to reduce a percentage of the silicon-containing process gas as a percentage of process gas in the process chamber while increasing a percentage of another process gas exposed to the micro-feature and having a higher deposition rate than the silicon-containing process gas; and
a controller configured to control the processing tool.

29. The processing tool according to claim 28, wherein the processing system comprises a batch type processing system or a single wafer processing system.

30. The processing tool according to claim 28, wherein the processing system comprises a batch type processing system containing a process tube.

31. The processing tool according to claim 28, further comprising a process monitoring system.

32. The processing tool according to claim 28, wherein the gas injection system is configured to expose the silicon-containing process gas and at least one of a hydrogen-containing gas and a germanium-containing gas to the micro-feature.

33. A processing tool for depositing a silicon-containing film in a micro-feature comprising:
a processing system;
a transfer system configured to provide a substrate including a micro-feature in a process chamber of the processing system;
a gas injection system configured to expose a silicon-containing process gas to the micro-feature in the processing system, wherein the silicon-containing process gas is selected form the group consisting of HCD, DCS,SICl$_4$, and siHCl$_3$; and
a controller configured to control the processing tool,
wherein the processing system comprises a thermal processing system, a plasma processing system, or an atomic layer deposition system.

34. A method of depositing a silicon-containing material in a micro-feature on a substrate, the method comprising:
providing a substrate including a micro-feature in a process chamber of a processing system;
exposing a silicon-containing process gas to the micro-feature, wherein the silicon-containing process gas is at least one of the group consisting of: HCD, DCS, SiCl$_4$, and SiHCl$_3$, or combinations thereof, in an amount sufficient to substantially fill the micro-feature while reducing a percentage of the silicon-containing process gas as a percentage of process gas in the process chamber and increasing a percentage of a second process gas exposed to the micro-feature with a higher deposition rate, and
depositing a silicon-containing material derived from the silicon-containing gas in the micro-feature.

35. A system for processing a substrate including a micro-feature comprising:
means for providing a substrate in a process chamber of a processing system; and
means for exposing a process gas containing at least one of the group consisting of: HCD, DCS, SiCl$_4$, and SiHCl$_3$ to the micro-feature while reducing a percentage of the silicon-containing process gas as a percentage of process gas in the process chamber and increasing a percentage of a second process gas exposed to the micro-feature with a higher deposition rate.

* * * * *

UNITED STATES PATENT AND TRADEMARK OFFICE
CERTIFICATE OF CORRECTION

| | | |
|---|---|---|
| PATENT NO. | : 7,205,187 B2 | Page 1 of 1 |
| APPLICATION NO. | : 11/035730 | |
| DATED | : April 17, 2007 | |
| INVENTOR(S) | : Allen J. Leith et al. | |

It is certified that error appears in the above-identified patent and that said Letters Patent is hereby corrected as shown below:

Column 14, line 9, claim 18, change "form" to --from--.
　　　　　　line 33, claim 22, change "form" to --from--.
　　　　　　line 46, claim 23, change "form" to --from--.
　　　　　　line 59, claim 24, change "form" to --from--.

Column 15, line 9, claim 26, change "form" to --from--.
　　　　　　line 21, claim 27, change "form" to --from--.

Column 16, line 17, claim 33, change "SICl$_4$" to --SiCl$_4$--., same line, change "siHCl$_3$" to　　　　--SiHCl$_3$--.

Signed and Sealed this

Thirty-first Day of July, 2007

JON W. DUDAS
*Director of the United States Patent and Trademark Office*